United States Patent [19]
Shintai et al.

[11] Patent Number: 5,362,775
[45] Date of Patent: Nov. 8, 1994

[54] EPOXY RESIN COMPOSITION AND CURED PRODUCT THEREOF

[75] Inventors: Akira Shintai, Obu; Hiroshi Shibata, Chita; Toshio Shiobara, Annaka; Koji Futatsumori, Annaka; Seizi Katayama, Annaka; Yasutaka Yoshida, Bisai, all of Japan

[73] Assignees: Nippondenso Co., Ltd., Kariya; Shin-Etsu Chemical Co., Ltd., Tokyo, both of Japan

[21] Appl. No.: 856,767

[22] Filed: Mar. 24, 1992

[30] Foreign Application Priority Data

Mar. 27, 1991 [JP] Japan ................................. 3-063351
Sep. 25, 1991 [JP] Japan ................................. 3-273100

[51] Int. Cl.$^5$ ...................... C08G 59/14; C08G 59/62; C08K 5/51
[52] U.S. Cl. ................................. 523/451; 523/403; 523/424; 523/425; 523/451; 525/476; 525/481; 525/482; 525/485; 525/487; 525/523; 525/534
[58] Field of Search ............... 523/451, 403, 424, 425, 523/457; 524/706, 730, 786; 525/481, 482, 485, 487, 523, 534, 476

[56] References Cited

U.S. PATENT DOCUMENTS

| | | | |
|---|---|---|---|
| 4,732,702 | 3/1988 | Yamazaki et al. | 523/457 |
| 5,001,174 | 3/1991 | Yanagisawa et al. | 523/443 |
| 5,073,580 | 12/1991 | Iinuma et al. | 523/442 |
| 5,089,543 | 2/1992 | Kurio et al. | 523/466 |
| 5,116,885 | 5/1992 | Hattori et al. | 523/220 |
| 5,143,951 | 9/1992 | Ohta et al. | 523/435 |

FOREIGN PATENT DOCUMENTS

| | | |
|---|---|---|
| 63-25010 | 5/1985 | Japan . |
| 62-53325 | 9/1987 | Japan . |
| 62-223218 | 10/1987 | Japan . |
| 62-240313 | 10/1987 | Japan . |
| 63-070446 | 3/1988 | Japan . |
| 63-160254 | 7/1988 | Japan . |

Primary Examiner—John Kight, III
Assistant Examiner—John M. Cooney, Jr.
Attorney, Agent, or Firm—Cushman, Darby & Cushman

[57] ABSTRACT

An epoxy resin composition comprising (i) an epoxy resin, (ii) a phenolic curing agent, (iii) an organophosphorous curing agent, (iv) alumina, and (v) a separating means for separating the organophosphorous curing agent and the alumina, which may be a coating over the surfaces of the organophosphorous curing agent.

21 Claims, 3 Drawing Sheets

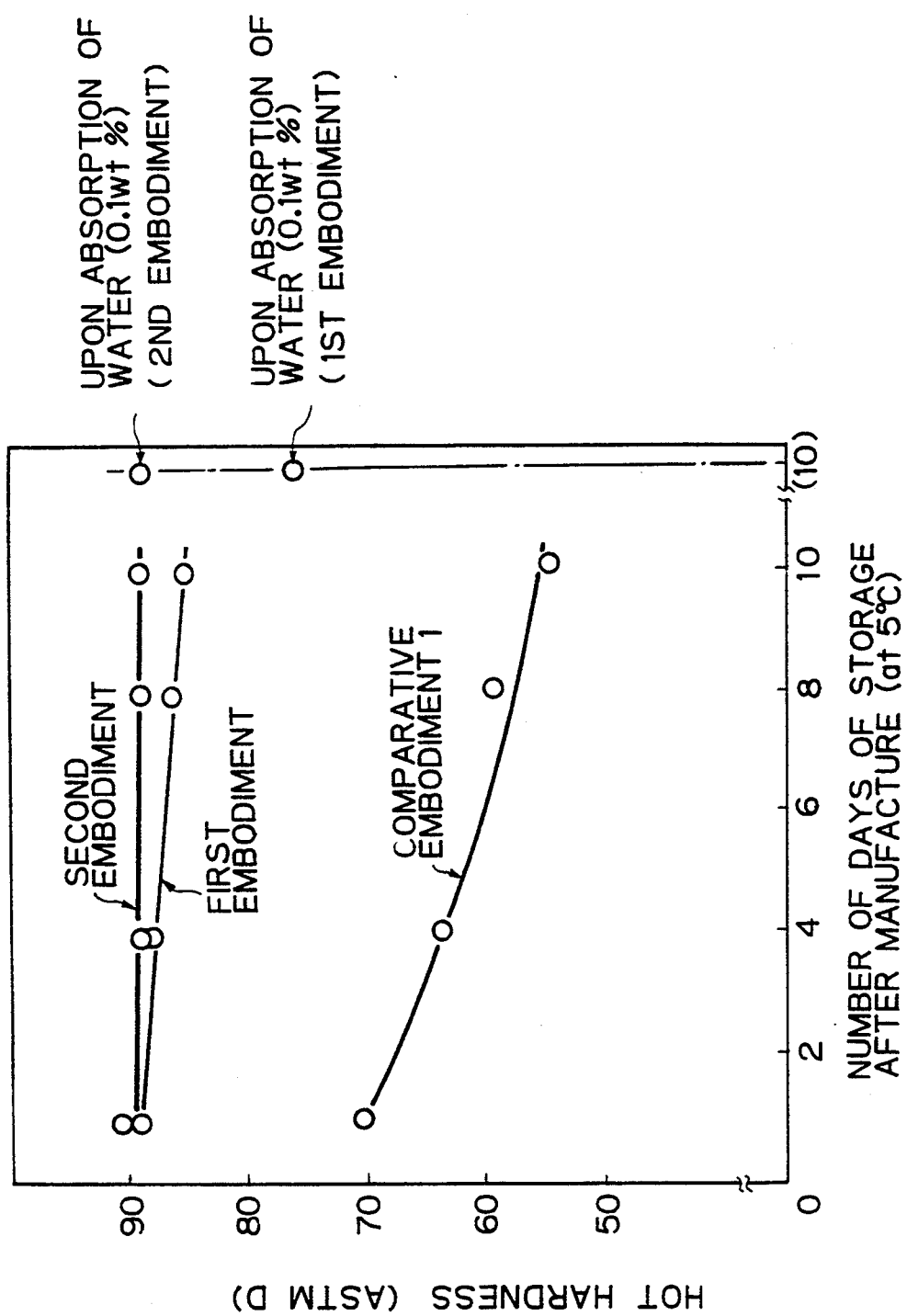

EPOXY RESIN COMPOSITION AND CURED PRODUCT THEREOF

BACKGROUND OF THE INVENTION

1. Field of the Invention

The present invention relates to an epoxy resin composition suitable for use in, for example, sealing a semiconductor device and a cured product of the same.

2. Description of the Related Art

For packages of semiconductor devices wide use has been made of epoxy resin compositions which give a cured product having excellent electrical characteristics, mechanical characteristics, chemical resistance, moisture resistance, and other properties. Among these, resin compositions comprised of novolak type epoxy resins in which phenol resins are mixed as curing agents and an inorganic filler is added are currently the main stream for, for example, resin sealing of semiconductor devices.

In recent years, however, along with the increasing size of chips and their improved performance, the demands on the sealing materials have become severer, and now a sealing material is sought having both of a high heat conduction and a low stress characteristic.

In the past, in a semiconductor device with a power device sealed with a resin, the heat of the power device was radiated through the molding resin or the molding resin was used to directly protect the devices. Therefore, the heat conductivity and the moisture resistance of the molding resin had an effect on the reliability of the device as a whole. The molding resin was a mixture of an epoxy resin and filler. In general, the filler used was fused silica or crystalline silica, but epoxy resin compositions using crystalline silica end up with larger coefficients of heat expansion and it is difficult to obtain a low stress characteristic. In addition, to increase the heat radiated from the devices, it is necessary to use a filler with a high heat conduction. As such fillers, alumina, silicon nitride, and magnesia, are known, but nitrides (silicon nitrides etc.) and magnesia are not suitable for sealing semiconductors since they are broken down with water vapor and increase the rate of the deterioration of the resin. Alumina is sufficiently stable with respect to water vapor and is suitable as a semiconductor sealing material (for example, Japanese Unexamined Patent Publication (Kokai) No. 63-160254 and Japanese Unexamined Patent Publication (Kokai) No. 62-24031).

On the other hand, to improve the moisture resistance, it is important to reduce the impurity ions in the resin, in particular chlorine ions which promote corrosion of aluminum. Chlorine is coupled in the resin as a subreaction when the epoxy group is added to the resin at the stage of synthesis of the epoxy resin. This reacts with the catalyst added to increase the curing speed of the resin at the time of molding of the resin and is present as free chlorine ions. Therefore, it is necessary to select the type of the curing catalyst to reduce the chlorine ions. In particular, an organic phosphorous catalyst (triphenylphosphine (TPP) etc.) can reduce the chlorine more than an imidazole catalyst (for example, Japanese Unexamined Patent Publication (Kokai) No. 62-223218).

Thus, when using alumina as an inorganic filler, it is possible to obtain an epoxy resin composition which satisfies both the requirements of a high heat conduction and a low stress characteristic. On the other hand, when using an organic phosphorus compound as a curing accelerator, it is known, an epoxy resin composition can be obtained which has superior curing characteristics, storage, heat resistance, electrical characteristics, moisture resistance, etc. Therefore, in a semiconductor device where the power device is sealed by a resin, to simultaneously achieve a satisfactory heat dispersion and moisture resistance, it is necessary to use alumina as the filler and an organic phosphorus catalyst as the catalyst.

However, the following was learned from experiments by the present inventors. That is, Comparative Embodiment 1 in Table 1 concerned a combination of an alumina filler and an organic phosphorous catalyst (TPP). As shown in FIG. 4, when the resin was stored after manufacture (after mixing of the resin and filler) and this was used for sealing the power device, the resin's degree of cure fell along with the storage time, in particular, suffering from a remarkable drop in the curing characteristics when the composition absorbs moisture.

TABLE 1

| | Comp. Embo. 1 | Comp. Embo 2 | Comp. Embo. 3 |
|---|---|---|---|
| Composition | | | |
| Resin (35 vol %) | Epoxy resin + phenol resin | | |
| Curing catalyst | TPP[Note 1] | Imidazole | TPP[Note 1] |
| Filler (65 vol %) | Alumina | Alumina | Crystalline silica |
| Curing characteristics (hot hardness 10 days after manufacture) | 55 | 89 | 89 |
| Moisture resistance (impurity ion Cl$^-$ ppm) | 8 | 35 | 8 |
| Heat dispersion (heat conductivity × 10$^{-4}$cal/cm°C.s) | 130 | 130 | 60 |
| Results of evaluation of product | | | |
| Heat dispersion (thermal resistance °C./W) | 2 | 2 | 5 |
| Moisture resistance (pressure cooker test hours) | 600 | 200 | 3000 or more |

Note [1] TPP stands for triphenylphosphine (organic phosphorus catalyst)

Further, the present inventor previously, in Japanese Examined Patent Publication (Kokoku) No. 63-25010, proposed an epoxy resin composition containing an epoxy resin, a phenol resin as a curing agent, a curing accelerator, and an inorganic filler, characterized in that as the epoxy resin use was made of a cresol novolak epoxy resin having a content of organic acids of 100 ppm or less, a content of chlorine ions of 2 ppm or less, a content of hydrolyzing chorine of 500 ppm or less, and an epoxy equivalent of 180 to 230, as the phenol resin use was made of a novolak type phenol resin having a softening point of 80 to 120° C., a content of organic acids of 100 ppm or less, free Na and Cl of 2 ppm or less, and free phenol of 1 percent or less, the molar ratio (a/b) of the epoxy groups (a) of the epoxy resin and the phenolic hydroxyl groups (b) of the phenol resin was adjusted to the range of 0.8 to 1.5, and, as the curing accelerator, use was made of a tertiary organic phosphine compound having in the molecule at least one functional group selected from a carboxyl group, methylol group, alkoxyl group, and hydroxyl group, more specifically 0.4 to 5 parts by weight of the compound shown by the following formula (I) per 100 parts by weight of the total of the epoxy resin and the phenol resin.

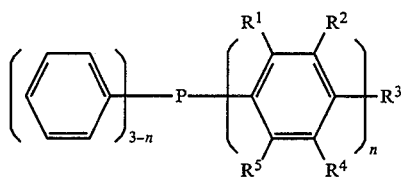

wherein, $R^1$ to $R^5$ independently represent a hydrogen atom, carboxyl group, methylol group, alkoxyl group, and hydroxyl group and at least one of $R^1$ to $R^5$ is selected from a carboxyl group, methylol group, alkoxyl group, and hydroxyl group, and n is an integer of from 1 to 3.

The epoxy resin composition has superior curing characteristics, electrical characteristics at a high temperature, heat resistance (i.e., high glass transition temperature Tg), and moisture resistance and as a result prevents aluminum wire from corroding or breaking even when a device is left under high temperature and humidity conditions for a long period and further is superior in moldability and has a high long term storage stability.

The present inventor, however, engaged in further studies on the epoxy resin composition proposed in Japanese Examined Patent Publication (Kokoku) No. 63-25010 and as a result discovered that when an IC formed using the epoxy resin composition is allowed to stand under high temperature and humidity conditions in a state with voltage applied to it, the aluminum wiring frequently breaks. Therefore, it was desired to resolve this problem.

SUMMARY OF THE INVENTION

Accordingly, an object of the present invention is to eliminate the above-mentioned problems and to provide an epoxy resin composition which is superior in storage stability, is able to swiftly cure during hot molding, is superior in high heat conduction and low stress characteristic, gives a cured product with excellent thermal, electrical, mechanical, and chemical characteristics, is superior in moisture resistance in a state with voltage applied, and is useful for sealing semiconductors, and of a cured product of the same.

Other objects and advantages of the present invention will be apparent from the following description.

In accordance with the present invention, there is provided an epoxy resin composition comprising (i) an epoxy resin, (ii) a phenolic curing agent, (iii) an organophosphorous curing accelerator, (iv) alumina, and (v) a separating means for separating the organophosphorous curing agent and the alumina.

In accordance with the preferred embodiment of the present invention, the above-mentioned separating means may be a coating of a coating agent (e.g., epoxy-modified silane coupling agent, silicone resin, ceramic) over the surface of alumina or a complexed organophosphorous curing accelerator.

BRIEF DESCRIPTION OF THE DRAWINGS

The present invention will be better understood from the description set forth below with reference to the accompanying drawings, wherein:

FIG. 2 is a graph showing the relationship between the number of days of storage after manufacture and the hot hardness.

DESCRIPTION OF THE PREFERRED EMBODIMENTS

The hardness of the resin declines due to the insufficient curing of the resin. This is thought to be due to the insufficient action of the catalyst in promoting the curing of the resin. In the case of alumina and an imidazole catalyst and the case of crystalline silica and an organic phosphorus catalyst (TPP) as in Comparative embodiments 2 and 3 of Table 1, this phenomenon does not appear. In view of this, it is considered that this phenomenon is due to the loss of activity of the alumina and the organic phosphorous catalyst. There are many active sites on the surface of alumina and the active sites are believed to change the catalyst.

Therefore, the first embodiment lies in a resin sealing type semiconductor device wherein a resin comprising mainly an epoxy resin has mixed into it alumina and an organic phosphorus curing catalyst and is used to seal a semiconductor chip, said resin sealing type semiconductor device characterized in that the alumina is given a coating covering the surface active sites of the alumina.

In the first embodiment, the coating agent covers the reaction active sites of the alumina, the reaction with the catalyst is suppressed, and thus the resin is cured.

Below, more detailed embodiments of the invention will be explained with reference to the drawings.

Figure 1:
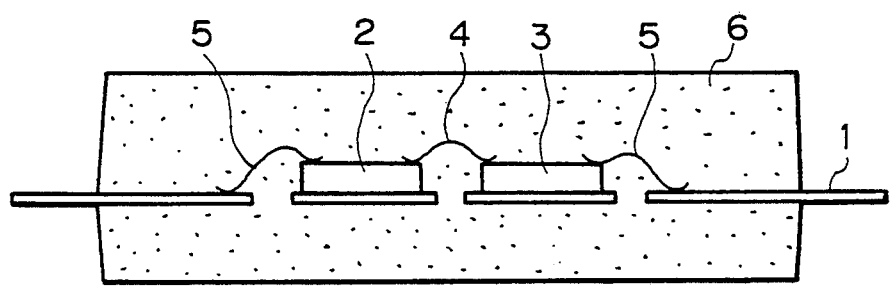
FIG. 1 is a sectional view of the resin sealed type semiconductor device of an embodiment of the present invention.

As shown in FIG. 1, a frame 1 has arranged on it a silicon chip (power device) forming a transistor and a silicon chip (control device) 3 forming a control circuit. The devices of the silicon chips 2 and 3 are electrically connected by the wiring 4 made of aluminum, while the silicon chips 2 and 3 and the frame 1 are electrically connected by the wiring 5. Further, the silicon chips 2 and 3 are made integral by the sealing resin 6. As shown in Table 2, the sealing resin 6 is a mixture of the organic phosphorus catalyst triphenylphosphine (TPP) and alumina in a base material comprised of epoxy resin and phenol resin.

TABLE 2

|  | First embodiment | Second embodiment |
|---|---|---|
| Composition | | |
| Resin (35 vol %) | Epoxy resin | + phenol resin |
| Curing catalyst | TPP[Note 1] | TPPTPB[Note 2] |
| Filler (65 vol %) | Coating alumina | |
| Curing Characteristic (hot hardness 10 days after manufacture) | 85 | 89 |
| Moisture resistance (impurity ion Cl$^-$ ppm) | 8 | 8 |
| Heat dispersion (heat conductivity × $10^{-4}$ cal/cm°C.s) | 130 | 130 |
| Results of evaluation of product | | |
| Heat dispersion (thermal resistance °C./W) | 2 | 2 |
| Moisture resistance (pressure cooker test hours) | 3000 or more | 3000 or more |

Note [1]TPP stands for triphenylphosphine (organic phosphorus catalyst).
Note [2]TPPTPB stands for tetraphenylphosphonium tetraphenylborate (SAKUENKA organic catalyst)

Further, the alumina is coated with a epoxy modified silane coupling agent to prevent inhibition of curing. This coating is formed by dispersing alumina powder into a solution of the epoxy modified silane coupling agent, then performing heat treatment to dry the same. Any method of coating the alumina may be used so long as it covers the surface active sites, for example, use may be made of coating by silicone or other resins, coating by silica or other ceramics, etc.

FIG. 2 shows the relationship between the storage period and hot hardness when storing the resin after manufacture (after mixing of the resin and filler) and using it to seal the silicon chips 2 and 3. From the graph, it is seen that the semiconductor device of the embodiment is effective against inhibition of curing. This is considered to be because the coating agent couples with the reaction active sites of the alumina and the suppresses the reaction with the catalyst.

Figure 4:
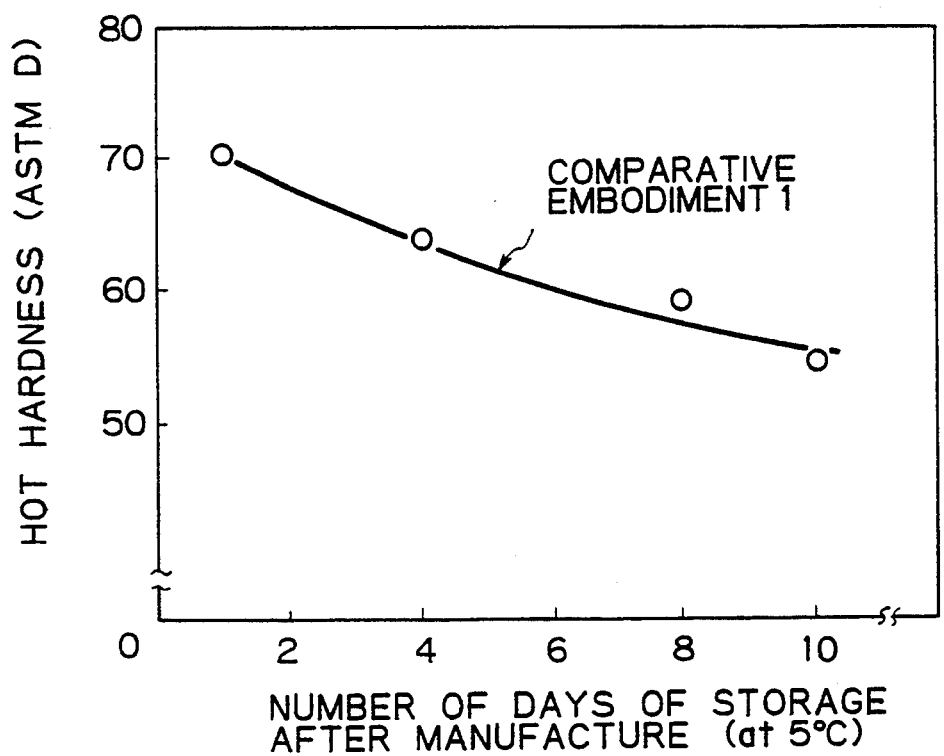
FIG. 4 is another graph showing the relationship between the number of days of storage after manufacture and the hot hardness.

Further, in Tables 1 and 2 and FIGS. 2 and 4, the degree of cure is the value of hardness of the resin measured by an ASTM Shore D hardness meter immediately after the molding die is opened after three minutes curing at 175° C.

Figure 3:
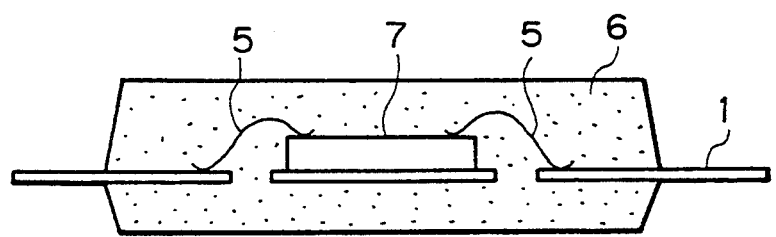
FIG. 3 is a sectional view of another resin sealing type semiconductor device.

In this way, in this embodiment, the alumina is given a coating covering the surface active sites of alumina. As a result, it is possible to use alumina with a film for suppressing the reaction with the curing catalyst, use alumina—a filler with a high heat conduction, and an organic phosphorous catalyst a—catalyst superior in moisture resistance. Due to this, the silicon chips 2 and 3 have good heat dispersion from the devices and further are superior in moisture resistance. Also, it is possible to avoid a reduction in the degree of cure of the resin after mixing of the resin and the filler. In particular, as shown in FIG. 1, when the power device and the device controlling the same are connected by fine aluminum wiring (wiring 4), this resin is effective since such fine aluminum wiring easily corrodes. Further, as shown in FIG. 3, in a structure where just a silicon chip 7 forming a power device is carried, such a resin is preferably used to prevent corrosion of the aluminum wiring on the surface of the device.

The second embodiment lies in a resin sealing type semiconductor device wherein a resin comprising mainly an epoxy resin has mixed into it alumina and an organic phosphorus curing catalyst and is used to seal a semiconductor chip, said resin sealing type semiconductor device characterized in that a complexed organic phosphorus catalyst is used as the above-mentioned curing catalyst.

In the second embodiment, the reaction between the catalyst and the alumina is suppressed by the complexing of the catalyst and therefore inhibition of the curing is prevented.

Next, a second embodiment will be explained.

In the first embodiment, as shown in FIG. 2, the curing declines if the resin absorbs moisture. That is, as shown in FIG. 2, if the resin 10 days after manufacture is made to absorb 0.1 percent by weight of water, the hot hardness falls from "86" to "76".

Therefore, in the second embodiment, in addition to the coating treatment of the first embodiment, as shown in Table 2, use was made of tetraphenyl-phosphonium tetraphenylborate as the complexed curing catalyst. As a result, as shown in FIG. 2, there is no inhibition of the curing and no reduction in the curing upon absorption of moisture occurs.

This is believed to be because if the catalyst is complexed, the reaction of the catalyst and alumina is suppressed by the ligands, so no inhibition of the curing occurs.

Further, the curing catalyst may be an organic phosphorus complex salt, but it is necessary to select one where there is no reduction in the curing characteristics during molding.

In this way, in the embodiment, use was made of a complexed organic phosphorus catalyst as the curing catalyst of the epoxy resin. As a result, due to the use of the complexed organic phosphoric curing agent, it is possible to simultaneously achieve satisfactory heat dispersion and moisture resistance without a catalytic poisoning action of alumina and to avoid a reduction of the degree of cure of the resin after mixing of the resin with the filler.

Tables 1 and 2 show the results of using of the resins of the prior art and the present invention for evaluation of products of the structure of FIG. 1. The heat dispersion from the power device was measured by the thermal resistance. Further, the moisture resistance was measured by the test time until corrosion and breakage of fine aluminum wiring ($\phi 50\mu m$) joining the power device and control device in a pressure cooker electrification test (121° C., 100%, 20V). As opposed to the comparative examples of Table 1, in the examples of the invention in Table 2, it was possible to greatly improve the low thermal resistance (heat discharge) and moisture resistance at the same time and possible to secure greater reliability of the product of this structure.

The present invention is not limited to the above embodiments. For example, it is possible to mix in other materials in addition to the alumina, such as fused silica, crystalline silica, etc. In particular, it is desirable to mix in fused silica to lower the stress.

Further, as the epoxy resin, use may be made of any of o-cresol novolak epoxy resin, bisphenol epoxy resin, or other epoxy resin. Also, to lower the stress, it is desirable to disperse silicone resin etc. in the epoxy resin.

The third embodiment of the present invention lies in an epoxy resin composition comprising the formulation, as a curing accelerator, of an organophosphorus compound having the general formula (1) below to an epoxy composition containing an epoxy resin, a phenolic curing agent and, as an inorganic filler, alumina

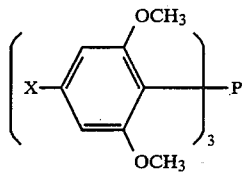

wherein, X represents a hydrogen atom or a methoxy group.

That is, the inventor discovered that even when alumina is used as the inorganic filler, the specific organic phosphorus compound represented by, for example, the above formula (1), unlike triphenylphosphine, does not cause a decline in the curing characteristics after absorption of moisture and further exhibits a sufficient catalytic action only at the heating temperature reached during molding, so there is no curing during the hot mixing with the epoxy resin, curing agent, and other components and during the subsequent storage, meaning superior storage stability, and further allows swift curing during the hot molding and gives a cured product with remarkably improved moisture resistance in a state with voltage applied. Therefore, the epoxy resin composition using alumina and the organic phosphorus compound represented by the formula (1) effectively exhibits the advantages of both the alumina and organic phosphorus compound, is superior in high heat conduction and low stress characteristic, and gives a cured product with excellent thermal, electrical, mechanical, and chemical characteristics, in particular, with the remarkable effect that an IC sealed with the epoxy resin composition is resistant to breakage of the aluminum wiring even when exposed to high temperature and humidity conditions in a state with voltage applied, it was discovered.

Further, it was discovered that by mixing in a silicone modified epoxy resin or a silicone modified phenol resin, polymers where an SiH group of an organosilicon compound expressed by the following general formula (2):

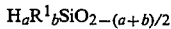

wherein, $R^1$ represents a substituted or unsubstituted monovalent hydrocarbon group, a and b are positive numbers integers satisfying the relationships of $0.01 \leq a \leq 1$, $1 \leq b \leq 3$, $1 \leq a+b < 4$, the number of silicon atoms in one molecule is an integer of from 20 to 400, and the number of hydrogen atoms directly coupled to the silicon atoms in a molecule is an integer of one or more is added to the alkenyl group of an alkenyl group-containing epoxy resin or alkenyl group-containing phenol resin, it is possible to achieve an excellent stress characteristic while achieving the above effect, whereupon the present invention was completed.

Therefore, the present invention provides an epoxy resin composition characterized by mixing, as essential components, the following:
(1) an epoxy resin,
(2) a phenolic curing agent,
(3) a curing accelerator having the formula (1), and
(4) alumina,
in particular an epoxy resin composition having mixed in the above-mentioned silicone modified epoxy resin or silicone modified phenol resin as the abovementioned components (1) and (2), and cured products of the same.

Below, explaining the present invention in more detail, the epoxy resin of the first essential component used for the epoxy resin composition of the present invention is not particularly limited so long as it has at least one, in particular two or more, epoxy groups in a molecule. For example, mention may be made of a bisphenol type epoxy resin, an alicyclic epoxy resin, a phenol novolak type epoxy resin, a cresol novolak type epoxy resin, a triphenolmethane type epoxy resin, a naphthalene ring-containing epoxy resin, an aralkyl group-containing epoxy resin, etc. These may be used alone or in mixtures of two or more.

As the epoxy resin used in the present invention, it is preferable to use one with a content of organic acids included in the same of 100 ppm or less, more preferably 20 ppm or less, chlorine ions of 2 ppm or less, more preferably 1 ppm or less, and a content of hydrolyzing chlorine of 500 ppm or less, more preferably 300 ppm or less. If even one of these conditions is not satisfied, the moisture resistance sometimes deteriorates.

Next, the phenolic curing agent (phenol resin) of the second essential component is not particularly limited in structure so long as it has at least two phenolic hydroxyl groups in the molecule. For example, phenol novolak resin, cresol novolak resin, naphthol resin, aralkyl phenol resin, triphenol resin, etc. may be suitably used. In the same way as with the abovementioned epoxy resin, it is preferable that the free Na and Cl in the phenol resin be made less than 2 ppm from the standpoint of the moisture resistance of the semiconductor. Further, if the amount of the phenol of the monomer contained in the same, that is, the free phenol, is over 1 percent, there is a detrimental effect on the above-mentioned moisture resistance, and when making a molded product by the composition, voids, non-filling, sink marks, and other defects tend to occur in the molded product, so the amount of the free phenol is preferably made less than 1 percent. Further, it is effective if the amount of the formic acid or other organic acid created by the Cannizzaro reaction of the minute amount of the formaldehyde remaining at the time of the manufacture of the phenol resin is less than 100 ppm from the standpoint of the moisture resistance of the semiconductor.

Further, the phenol resin has a lower glass transition temperature (Tg) if the softening point becomes less than 80° C., so the heat resistance sometimes becomes poorer. If the softening point is over 120° C., the melt viscosity of the epoxy resin composition becomes high and the workability deteriorates in some cases. In both cases, the moisture resistance is liable to deteriorate, so the softening point of the phenol resin is preferably made from 80° to 120° C.

Note that the more preferable range of the free phenol in the phenol resin is 0.3 percent or less, the more preferable range of the amount of the organic acids is 30 ppm or less, and the more preferable range of the softening point of the phenol resin is 90 to 110° C. By adjusting to this range, it is possible to more reliably achieve the object of the present invention.

Further, the composition of the present invention preferably has mixed in it a silicone modified phenol resin and/or silicone modified epoxy resin, whereby the moisture resistance in a state with voltage applied increases more remarkably and a composition giving a cured product having a low coefficient of linear expansion and a low modulus of elasticity can be obtained.

The silicone modified phenol resin or the silicone modified epoxy resin is a polymer with an SiH group of an organosilicon compound expressed by the following general formula (2):

$$H_a R^1_b SiO_{2-(a+b)/2} \quad (2)$$

wherein, $R^1$ represents a substituted or unsubstituted monovalent hydrocarbon group, preferably a methyl group, ethyl group, or other alkyl group with one to three carbon atoms, a phenyl group or other aryl group with six to 10 carbon atoms, $ClC_3H_6-$,

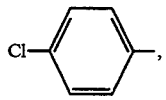

other groups with one or more hydrogen atoms of these groups substituted with a halogen atom, and $C_2H_4Si(OCH_3)_3$, $-C_3H_6Si(OCH_3)_3$, $-C_2H_4Si(OC_2H_5)_3$, $-C_2H_4Si(CH_3)(OCH_3)_2$ or other group with some of the hydrogen atoms substituted with an alkoxyl group, a and b are positive numbers satisfying the relationships of $0.01 \leq a \leq 1$, preferably $0.03 \leq a \leq 0.5$, $1$, $1 \leq b \leq 3$, preferably $1.95 \leq b \leq 2.05$, $1 \leq a+b < 4$, preferably $1.8 \leq a+b \leq 2.4$, the number of silicon atoms in one molecule is an integer of from 20 to 400, and the number of hydrogen atoms directly coupled to the silicon atoms in a molecule is an integer of one or more, preferably 1 to 5 is added to the alkenyl group of an alkenyl group-containing epoxy resin or alkenyl group-containing phenol resin.

In this case, as the alkenyl group-containing epoxy resin or alkenyl group-containing phenol resin, more suitably use is made of the alkenyl group-containing epoxy resin or phenol resin expressed by the following formula (3). The addition polymer of this with the organosilicon compound expressed by the above-mentioned formula (2) is effective.

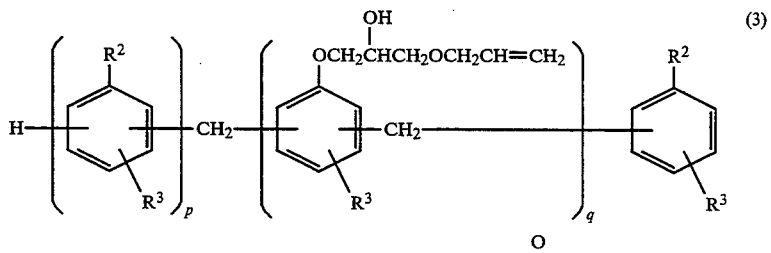

wherein, $R^2$ is $-OCH_2CH-CH_2$ or a hydroxyl group, p and q are integers of the relationship $0 \leq P \leq 10$, $1 \leq q \leq 3$, and $R^3$ is a hydrogen atom or methyl group.

In this case, the above-mentioned silicone modified epoxy resin or phenol resin preferably has a content of hydrolyzing chlorine of 500 ppm or less, free NA and CL ions of 2 ppm or less each, and a content of organic acids of 100 ppm or less. If the contents of the hydrolyzing chlorine, free NA and Cl ions, and organic acids exceed the above-mentioned values, the heat resistance of the sealed semiconductor device becomes poorer.

The above-mentioned silicone modified epoxy resin or phenyl resin may be mixed in alone or in a mixture preferably 5 to 70 parts (parts by weight, same below), particularly 8 to 50 parts, per 100 parts of the total of the epoxy resin and curing agent mixed in the composition. If the amount of the silicone modified epoxy resin or phenol resin is less than 5 parts, a sufficient low stress characteristic is difficult to obtain and if over 70 parts, the mechanical strength of the molded product falls in some cases.

In the present invention, it is preferable to adjust the epoxy resins and the phenol resins, including the silicone modified epoxy resins or phenol resins, so that the molar ratio (a/b) between the epoxy groups (a) of the epoxy resins and the phenolic hydroxyl groups (b) of the phenol resins becomes in the range of 0.8 to 1.5, preferably 0.9 to 1.5. If the molar ratio of the two groups becomes less than 0.8, the curing characteristics of the composition and the glass transition temperature (Tg) of the molded product deteriorate and the heat resistance falls, while if larger than 1.5, the glass transition temperature of the molded product and the electrical characteristics become poorer.

Next, the composition of the present invention uses as the curing accelerator the organic phosphorus compound expressed by the following general formula (1), more specifically (1a) and (1b):

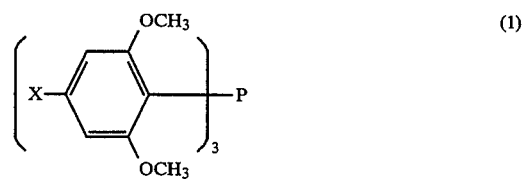

wherein, X is a hydrogen atom or methoxy group.

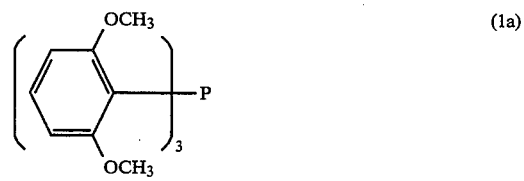

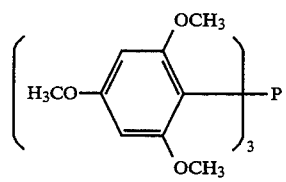

That is, use is made of a tertiary organic phosphine compound having methoxy groups introduced at the 2-position and 6-position of triphenylphosphine or a tertiary organic phosphine compound with a methoxy group introduced at the 4-position in addition to the 2-position and 6-position. With other compounds, for example, triphenylphosphine with no methoxy group introduced or triphenylphosphine with a methoxy group introduced just at the 4-position, the object of the present invention cannot be achieved.

Further, in the present invention, the compound of formula (1) may be used alone as the curing accelerator, but it is also possible to use it with another curing accelerator, As the other curing accelerator, in particular 1,8-diazabicyclo-7-undecene is preferably used from the standpoint of the moisture resistance of the composition.

The amount of the compound of formula (1) mixed in is preferably 1 to 10 parts, particularly 0.3 to 5 parts, with respect to 100 parts of the total of the epoxy resin used as the first component and the phenolic curing agent (e.g., phenol resin) used as the second component. If the amount is less than 0.1 part, the curing characteristics become poor in some cases, while if over 10 parts, the storage stability and moisture resistance become poor in some cases. Note that when also using 1,8-diazabicyclo-7-undecene, it is preferable to use 0.02 to 2 parts of 1,8-diazabicyclo-7-undecene with respect to 1 part of the compound expressed by formula (1).

Next, in the present invention, alumina is mixed in as an inorganic filler to impart a low expansion characteristic and a high heat conduction. The form of the alumina is not particularly limited, but one of a spherical or close to spherical shape is preferable. The average particle size is preferably 5 to 75 microns, but use may also be made of alumina of an average particle size of 0.1 to 5 microns in a range not exceeding 30 percent of the overall inorganic filler.

Further, as the alumina, one with a sodium, chlorine, or other impurity content of 10 ppm or less, in particular 5 ppm or less, is preferable. Note that use may be made with the alumina of another inorganic filler such as aluminum nitride in accordance with need. In this case too, it is necessary to make the content of the alumina in the overall inorganic filler at least 30 percent by weight to achieve the object of the present invention.

Further, the amount of the inorganic filler included in the composition is not particularly limited, but it is preferable if it is at least 60 percent by weight of the composition as a whole.

Note that the inorganic filler may be treated in advance by a silane coupling agent. In this case, as the silane coupling agent used for the treatment, suitable use may be made of a hydrolyzing residual group containing silane such as shown by the following structural formula (4):

$$R^4{}_{4-c}Si(OR^5)_c \tag{4}$$

In the above-mentioned formula, as $R^4$, mention may be made of a hydrogen atom, methyl group, ethyl group, propyl group, phenyl group, or other nonfunctional alkyl groups, alkenyl groups, aryl groups, and further the following with epoxy, amino, acryl, alkenyl, and acyl functions:

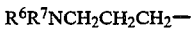

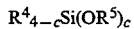

$R^6R^7NCH_2CH_2CH_2-$ wherein $R^6$, $R^7=H$, $C_dH_{2d+1}$ or $C_6H_5CH_2$ and d=integer of 1 to 6

$CH_2=C(R^3)COO(CH_2)_n-$ wherein $R_8=H$ or $CH_3$, n=integer of 1 to 3

$CH_2=CH(CH_2)_m-$, wherein m=integer of 0 to 4

$HOCC(CH_2)_l-$, wherein l=integer of 2 to 18.

On the other hand, as $R^5$ mention may be made of an alkoxy group, alkenyl group, aryl group, carbonyl group, etc. The methyl group, ethyl group, isopropyl group, etc. among these are most general. Further, c is 1 to 4, but c is preferably 3 or 4.

As the method of treating the inorganic filler by a silane coupling agent, use may be made of either the dry method or the wet method. The dry method means a ball mill, Henschel mixer, etc., while the wet method means mixing the silane coupling agent in the inorganic filler in a solvent and stirring the same. The amount of the silane coupling agent is 0.001 to 8 parts per 100 parts of the inorganic filler, preferably 0.01 to 5 parts. If the amount of the silane coupling agent is too small, the effect of the treatment, that is, the improvement of the moisture resistance, does not appear and if too large, the burr characteristics etc. conversely end up deteriorating in some cases. These silane coupling agents may be used in mixtures of two or more. Further, use may be made of ones partially hydrolyzed in advance. As the solvent used for the wet method, mention may be made of toluene, xylene, and other hydrocarbons, methanol, ethanol, isopropyl alcohol, and other alcohols, acetone, 2-butanone, and other ketones, isopropylether, tetrahydrofuran, and other ethers, etc. Use may also be made at the same time of water and tin, titanium, or amine compounds as a hydrolysis accelerator. After being treated in this way, the mixture may be sintered in a heating furnace of a temperature of 400° to 1200° C. or so.

The composition of the present invention may further have mixed in it various types of additives as needed in accordance with its objective of use, application, etc. For example, there is no problem with mixing in waxes, stearic acid and other fatty acids and metal salts thereof and other dye release agents, carbon black and other pigments, dyes, flame retardants, surface treatment agents (γ-glycidoxypropyltrimethoxysilane etc.), antiaging agents, and other additives.

The composition of the present invention may be obtained by uniformly stirring and mixing predetermined amounts of the above-mentioned components, kneading the result with a roll, kneader, etc. preliminarily heated to 60° to 95° C., cooling, and then pulverizing. Note that the order of mixing of the components is not particularly limited.

The epoxy resin composition of the present invention is suitably used for sealing IC's, LSI's, transistors, thyristors, diodes, and other semiconductor devices, the manufacture of printed circuit boards, etc. Note that when sealing a semiconductor device, it is possible to make use of conventionally used molding methods, such as transfer molding, injection molding, casting, etc. In this case, the epoxy resin composition is preferably molded at a temperature of 150° to 180° C. and post-cured at 150 to 180° C. for 2 to 16 hours.

EXAMPLES

The present invention will now be explained in detail with reference to the following Examples and Comparative Examples, but the present invention is not limited to these Examples. Note that the "parts" in the Examples and Comparative Examples mean "parts by weight".

EXAMPLES 1 TO 4 AND COMPARATIVE EXAMPLES 1 TO 4

Fifty parts of a silicone modified epoxy resin, an addition reaction product of the alkenyl group containing epoxy resin shown by the following formula (5) and the organosilicon compound shown by the following formula (6), 13 parts of cresol novolak type epoxy resin having an epoxy equivalent of 230, 5 parts of bromided epoxy resin having an epoxy equivalent of 280, 32 parts of phenol novolak resin having a phenol equivalent of 100, 1.5 parts of carnauba wax, 1.5 parts of γ-glycidoxy-propyltrimethoxysilane, 1.2 parts of carbon black, and the inorganic fillers and curing accelerators shown in Table 3 were kneaded by a hot roll of 70° to 80° C. and the result was cooled and pulverized to obtain the epoxy resin composition.

Hardness

The hot hardness after 2 minutes molding at 175° C./70 kg·cm$^{-2}$ using a transfer molding machine was measured using a Bacall Hardness Meter 935.

Note that the value measured directly after preparation of the epoxy resin composition was used as the initial hardness and the hardness of the composition forcibly made to absorb moisture after preparation and having a moisture content of 0.15 percent by weight was used as the moisture absorption hardness.

Coefficient of Linear Expansion and Glass Transition Temperature

The value was measured using a 4 mmφ × 15 mm test piece and raising the temperature at a rate of 5° C. a minute by a dilatometer.

Heat Conductivity

A 50 mmφ × 6 mm test piece was inserted between an upper heater and calorimeter and a lower heater in a sandwich fashion, was brought into close contact with the same at a constant pressure by air pressure, and the temperature difference between the two sides of the test piece after reaching a steady state at 50° C. and the output of the calorimeter were used to automatically calculate the heat conductance. The heat conductivity was found from the product of the heat conductance and the thickness of the test piece.

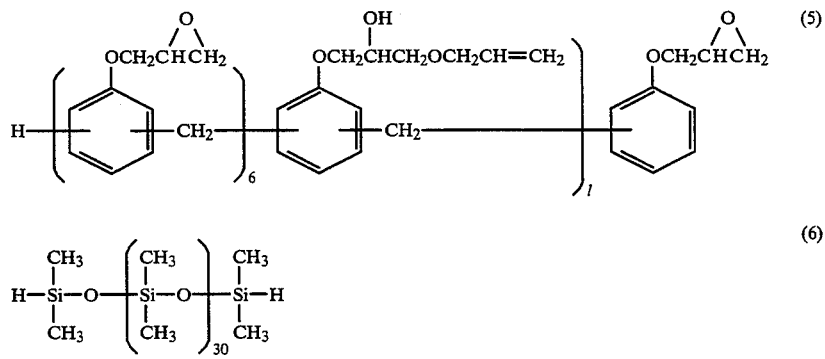

wherein numerals in the formula are average values.

The hardness, glass transition temperature, coefficient of linear expansion, heat conductivity, and aluminum wiring corrosion rate (moisture resistance of power IC) of these epoxy resin compositions were evaluated by the following methods. The results are shown in Table 1.

Aluminum Corrosion Test

One hundred 14-pin IC's having aluminum wiring on the chip were formed by a transfer molding machine. The moldings were post-cured at 180° C. for 4 hours, then 20V of voltage was applied. The IC's were allowed to stand in that state in a test tank of 130° C. and 85 percent relative humidity for 100 hours, then breakage of the aluminum wiring was examined to make a judgement on the rejects (n=20).

TABLE 3

|  | Example | | | | Compartive Example | | | |
|---|---|---|---|---|---|---|---|---|
|  | 1 | 2 | 3 | 4 | 1 | 2 | 3 | 4 |
| Mixture (parts) | | | | | | | | |
| Inorganic filler | | | | | | | | |
| Alumina A* | 700 | 500 | 500 | 500 | 500 | 500 | | |
| Fused silica A** | | 150 | 150 | | 150 | 150 | 450 | |
| Crystalline silica A*** | | | | 150 | | | | 550 |
| Curing accelerator | | | | | | | | |
| Tris(2,6-dimethoxyphenyl)phosphine | 1.2 | 1.2 | | 1.2 | | | 1.2 | 1.2 |
| Tris(2,4,6-trimethoxylphenyl)phosphine | | | 1.2 | | | | | |
| Triphenyl phosphine | | | | | 0.8 | | | |
| 2-phenylimidazole | | | | | | 0.8 | | |
| Test values | | | | | | | | |

TABLE 3-continued

| | Example | | | | Compartive Example | | | |
|---|---|---|---|---|---|---|---|---|
| | 1 | 2 | 3 | 4 | 1 | 2 | 3 | 4 |
| Initial hardness | 83 | 82 | 83 | 83 | 78 | 82 | 80 | 82 |
| Hardness upon absorption of moisture | 80 | 78 | 79 | 79 | 62 | 78 | 76 | 77 |
| Glass transition temperature (°C.) | 172 | 174 | 173 | 172 | 152 | 170 | 172 | 172 |
| Coefficient of linear expansion ($10^{-5}$/°C.) | 1.5 | 1.3 | 1.3 | 1.6 | 1.3 | 1.3 | 1.2 | 1.9 |
| Heat conductivity ($10^{-4}$cal/cm.sec.°C.) | 92 | 61 | 60 | 71 | 61 | 62 | 16 | 60 |
| Aluminum wiring corrosion rate (reject rate %) | 0 | 0 | 0 | 0 | 5 | 100 | 10 | 20 |

*Alumina A: Alumina prepared by placing 600 parts of spherical alumina (average particale size of 11 μm) in a ball mill, spraying 2.5 parts of γ-glycidoxytripropylmethoxysilane containing 0.05 percent by weight of 1,8-diazabicyclo-7-undecene for uniform dispersion, then heat treating at 150° C. for 20 hours.
**Fused silica A: Pulverized fused silica of an average particle size of 11 μm.
***Crystalline silica A: Crystalline silica of an average particle size of 21 μm.

From the results of Table 3, it is seen that when triphenylphosphine is used as the curing accelerator and use is also made of alumina (Comparative Example 1), the moisture absorption hardness is poor, the glass transition temperature is low, and there is bad aluminum corrosion. When an imidazole is used as the curing accelerator (Comparative Example 2), the corrosion of aluminum is extremely bad. Further, when fused silica is used as the inorganic filler (Comparative Example 3), the coefficient of linear expansion is low, but the heat conductivity is poor and the corrosion of aluminum is also bad. Further, when crystalline silica is used as the inorganic filler (Comparative Example 4), the coefficient of linear expansion is large and as a result the corrosion of aluminum is bad.

As opposed to this, the compositions (examples) of the present invention using alumina as the inorganic filler and using the organic phosphorus compound shown in formula (1) as the curing accelerator has a good moisture absorption hardness, a high glass transition temperature, and a low coefficient of linear expansion and further has a high heat conductivity, so is superior in low stress characteristic and superior against aluminum corrosion, it was confirmed.

As explained above, the epoxy resin composition of the present invention has excellent storage stability and is provided with both a low stress characteristic and a high heat conduction, is excellent in thermal, electrical, mechanical, and chemical characteristics, in particular gives a cured product superior in moisture resistance in a state with voltage applied, and is useful for sealing semiconductor devices.

We claim:

1. An epoxy resin composition comprising:
   (i) an epoxy resin;
   (ii) a phenolic curing agent;
   (iii) an organophosphorus curing accelerator;
   (iv) alumina; and
   (v) a coating layer coating said alumina; said coating layer comprising a silane coupling agent whereby said alumina is separated from said organophosphorus curing accelerator.

2. An epoxy resin composition as claimed in claim 1, wherein said organophosphorus curing accelerator is a complexed organophosphorus curing accelerator.

3. An epoxy resin composition as claimed in claim 1, wherein said organophosphorus curing accelerator has the formula (1):

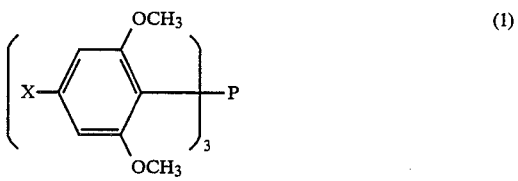

wherein X represents a hydrogen atom or a methoxy group.

4. An epoxy resin composition as claimed in claim 1, wherein the curing accelerator is tris(2,6-dimethoxyphenyl)phosphine.

5. An epoxy resin composition as claimed in claim 1, wherein the curing accelerator is tris(2,4-6-trimethoxyphenyl)phosphine.

6. An epoxy resin composition as claimed in claim 1, wherein said epoxy resin is a silicone modified epoxy resin where an SiH group of an organosilicon compound having the formula (2):

wherein $R^1$ represents a substituted or unsubstituted monovalent hydrocarbon group, a and b are positive numbers satisfying the relationships of $0.01 \leq a \leq 1$, $1 \leq b \leq 3$, $1 \leq a+b < 4$, the number of silicon atoms in one molecule is an integer of from 20 to 400, and the number of hydrogen atoms directly coupled to the silicon atoms in a molecule is an integer of one or more, is added to the alkenyl group of an alkenyl group-containing epoxy resin.

7. An epoxy resin composition as claimed in claim 1, wherein said phenolic curing agent is a silicone modified phenol resin wherein an SiH group of an organosilicon compound having the formula (2):

wherein $R^1$ represents a substituted or unsubstituted monovalent hydrocarbon group, a and b are positive numbers satisfying the relationships of $0.01 \leq a \leq 1$, $1 \leq b \leq 3$, $1 \leq a+b < 4$, the number of silicon atoms in one molecule is an integer of from 20 to 400, and the number of hydrogen atoms directly coupled to the silicon atoms in a molecule is an integer of one or more, is added to the alkenyl group of an alkenyl group-containing phenol resin.

8. An epoxy resin composition as claimed in claim 4, wherein said epoxy resin is a silicone modified epoxy resin wherein an SiH group of an organosilicon compound having the formula (2):

$$H_a R^1_b SiO_{2-(a+b)/2} \quad (2)$$

wherein $R^1$ represents a substituted or unsubstituted monovalent hydrocarbon group, a and b are positive numbers satisfying the relationships of $0.01 \leq a \leq 1$, $1 \leq b \leq 3$, $1 \leq a+b < 4$, the number of silicon atoms in one molecule is an integer of from 20 to 400, and the number of hydrogen atoms directly coupled to the silicon atoms in a molecule is an integer of one or more, is added to the alkenyl group of an alkenyl group-containing epoxy resin.

9. An epoxy resin composition as claimed in claim 5, wherein said epoxy resin is a silicone modified epoxy resin wherein an SiH group of an organosilicon compound having the formula (2):

$$H_a R^1_b SiO_{2-(a+b)/2} \quad (2)$$

wherein $R^1$ represents a substituted or unsubstituted monovalent hydrocarbon group, a and b are positive numbers satisfying the relationships of $0.01 \leq a \leq 1$, $1 \leq b \leq 3$, $1 \leq a+b < 4$, the number of silicon atoms in one molecule is an integer of from 20 to 400, and the number of hydrogen atoms directly coupled to the silicon atoms in a molecule is an integer of one or more, is added to the alkenyl group of an alkenyl group-containing epoxy resin.

10. An epoxy resin composition as claimed in claim 1, wherein said silane coupling agent is an epoxy modified silane coupling agent.

11. An epoxy resin composition as claimed in claim 2, wherein said silane coupling agent is an epoxy modified silane coupling agent.

12. An epoxy resin composition as claimed in claim 1, wherein said silane coupling agent is a hydrolyzing residual group-containing silane.

13. An epoxy resin composition as claimed in claim 3, wherein said silane coupling agent is a hydrolyzing residual group-containing silane.

14. An epoxy resin composition as claimed in claim 6, wherein said silane coupling agent is a hydrolyzing residual group-containing silane.

15. An epoxy resin composition as claimed in claim 7, wherein said silane coupling agent is a hydrolyzing residual group-containing silane.

16. An epoxy resin composition as claimed in claim 1, wherein said silane coupling agent is $\gamma$-glycidoxytripropylmethoxysilane.

17. An epoxy resin composition as claimed in claim 4, wherein said silane coupling agent is $\gamma$-glycidoxytripropylmethoxysilane.

18. An epoxy resin composition as claimed in claim 5, wherein said silane coupling agent is $\gamma$-glycidoxytripropylmethoxysilane.

19. An epoxy resin composition as claimed in claim 8, wherein said silane coupling agent is $\gamma$-glycidoxytripropylmethoxysilane.

20. An epoxy resin composition as claimed in claim 9, wherein said silane coupling agent is $\gamma$-glycidoxytripropylmethoxysilane.

21. A cured product obtained by curing the epoxy resin composition of any one of claims 1 to 20.

* * * * *